United States Patent [19]

Savage et al.

[11] Patent Number: 4,964,020
[45] Date of Patent: Oct. 16, 1990

[54] EQUIPMENT RACK

[75] Inventors: Dale A. Savage, Fort Lauderdale, Fla.; Sidney H. Spencer, Reisterstown, Md.

[73] Assignee: AT&T Bell Laboratories, Murray Hill, N.J.

[21] Appl. No.: 413,512

[22] Filed: Sep. 27, 1989

[51] Int. Cl.⁵ ............................................... H02B 1/01
[52] U.S. Cl. .................................... 361/429; 211/190; 312/265.3; 361/380
[58] Field of Search .......... 211/26, 102, 103, 189–191; 220/4 F, 8; 312/257.1, 260, 263, 265.1–265.6, 272; 361/380, 390, 428, 429

[56] References Cited

U.S. PATENT DOCUMENTS

| | | | |
|---|---|---|---|
| 4,235,493 | 11/1980 | Bridges et al. | 312/265.3 |
| 4,553,674 | 11/1985 | Yoshikawa et al. | 211/189 |
| 4,603,377 | 7/1986 | Kobayashi et al. | 361/429 |
| 4,753,354 | 6/1988 | Patterson et al. | 211/190 |
| 4,860,168 | 8/1989 | Wiljanen et al. | 361/428 |

FOREIGN PATENT DOCUMENTS 2115404  10/1972  Fed. Rep. of Germany ...... 361/429

Primary Examiner—Gregory D. Thompson
Attorney, Agent, or Firm—Glen Books

[57] ABSTRACT

An equipment rack is disclosed whose frame member arms include protrusions, or a protrusion and a flange, that serve a dual function. First, the protrusions, or protrusion and flange, serve to define channels suitable for receiving a cable restraint device which serves to separately bundle cables according to type and/or function. Second, the protrusions serve as keyways along which additional, movable frame members slide telescopically to achieve a rack extendible to a wide variety of heights. Preferably, the inventive rack is of aluminum, resulting in a rack that is essentially as sturdy as the conventional steel racks but significantly lighter and easier to install.

12 Claims, 10 Drawing Sheets

EQUIPMENT RACK

BACKGROUND OF THE INVENTION

1. Field of the Invention

The invention pertains to equipment racks.

2. Art Background

A rack, as used in this disclosure, denotes a frame-like structure adapted to hold and display equipment, such as electronic equipment. Such racks are employed in a variety of settings including, for example, the central offices of telephone companies and hospital operating rooms.

In the past, the racks employed in, for example, telephone company central offices were used to hold the electromechanical relays employed in switching telephone calls between subscribers. Although switching is now typically achieved electronically, and the racks employed by the telephone companies are now more generally used to hold electronic equipment, including electronic telephone switching and electronic telephone transmission equipment, these racks are still often referred to as relay racks.

Figure 1:
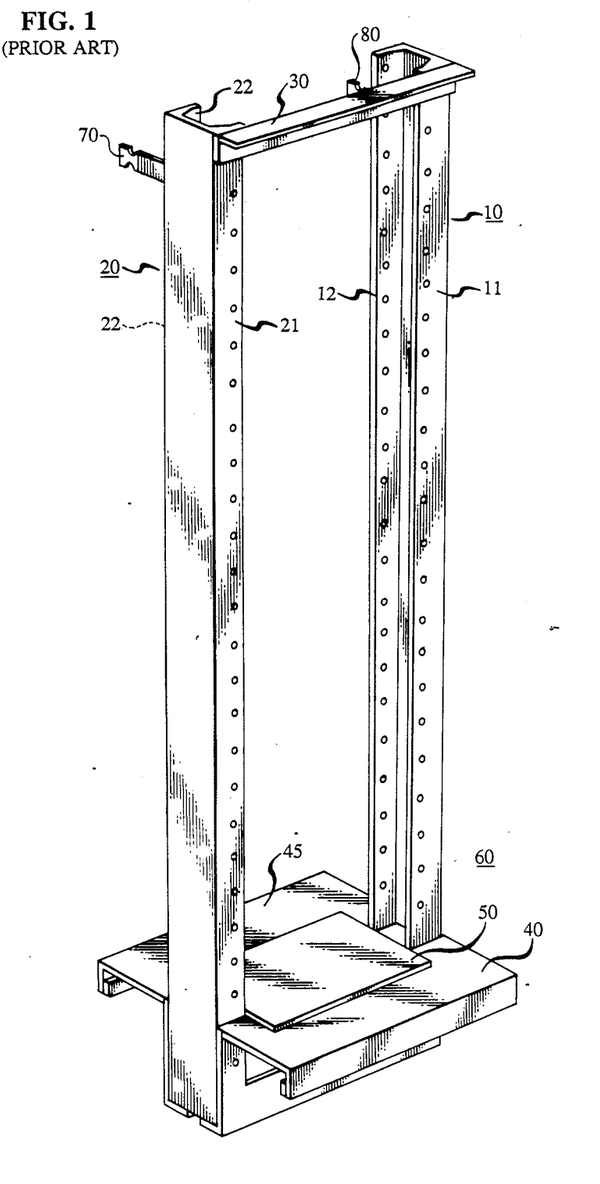
FIG. 1 depicts a conventional channel relay rack.

At present, the (relay) racks employed by the telephone companies are typically of two types. The first type, depicted in FIG. 1, is generally referred to as a channel relay rack, and conventionally includes generally parallel (in use, generally vertically oriented) steel frame members 10 and 20, which are U-shaped in cross section. The arms 11, 12, 21 and 22 (see FIG. 1) of these U-shaped frame members are apertured at regular intervals along their lengths, with the arms of one U-shaped frame member pointing toward the arms of the other U-shaped frame member. An angle iron 30 and an apparatus 60, which are welded or bolted to, respectively, the tops and bottoms of the U-shaped frame members, serve to connect the U-shaped members. In addition, the apparatus 60, often referred to as a guardrail, serves to prevent equipment mounted in the relay rack from being struck by the ladders used by operating personnel to inspect the equipment. That is, as shown in FIG. 1, the guardrail 60 includes two members 40 and 45 which, in cross section, have inverted L-shapes. The inverted L-shaped members 40 and 45 are connected to the bottoms, and extend between, the U-shaped frame members 10 and 20. A rectangular, sheet-like member 50, positioned between the U-shaped frame members 10 and 20, is connected to the inverted L-shaped members 40 and 45 via screws or bolts, and thus serves to connect the members 40 and 45 to each other. As is evident, the protruding flanges of the inverted L-shaped members 40 and 45 extend by a fixed distance from the front and back of the channel relay rack, and thus serve to deflect ladders from striking the equipment.

Significantly, the U-shaped frame members 10 and 20 are conventionally manufactured in four different heights, i.e., 7 feet (2.13 meters), 9 feet (2.74 meters), 10½ feet (3.20 meters) and 11½ feet (3.50 meters). As a consequence, the conventional channel relay rack is typically only available in four (corresponding) different heights.

Equipment is mounted in the conventional channel relay rack by initially attaching laterally projecting flanges to the front or back of the equipment. Then, the equipment is inserted between the frame members 10 and 20 until the laterally projecting flanges are flush with the arms of the frame members 10 and 20, and screws or bolts are inserted through apertures in the flanges aligned with apertures in the frame member arms. It must be noted that the equipment is mounted either before or after the rack is sold. That is, in many instances, equipment, such as the electronic equipment employed in telephonic signal switching or telephonic signal transmission, is mounted in the rack immediately after rack manufacture, and the equipment-filled rack is sold as an integral unit. Alternatively, the rack is sold empty of equipment, and equipment is mounted in the rack by the purchaser.

After a rack is sold (either with or without equipment) and installed, equipment mounted in the rack is typically examined and/or accessed with the aid of ladders. As discussed, the guardrail 60 serves to prevent the ladders from hitting the equipment.

In, for example, telephone company central offices, electrical power is delivered to equipment mounted in a channel relay rack through power cables extending from an overhead, generally horizontally positioned, ladder-like cable rack. Similarly, electrical signals are transmitted from, and received by, the equipment through transmission cables also extending from an overhead cable rack (different from that used for the power cables). In addition, in many instances, special purpose alarm cables are provided, extending from yet another overhead cable rack to the equipment, and from the equipment to remote alarm equipment in the telephone company central office, the alarm cables serving to communicate signals from the equipment to the remote alarm equipment indicative of equipment malfunctions. Significantly, further physical separation between the transmission cables and the power cables, beyond that achieved through the use of different cable racks, is needed to avoid creating spurious electrical signals in the transmission cables due to electrical noise in the power cables (the alarm cables are generally insensitive to such noise). This additional separation is achieved in a conventional channel relay rack, as shown in FIG. 1, through the use of right-angle steel brackets 70 and 80, generally referred to as cable brackets, bolted to the back of the relay rack. That is, in operation, the power and alarm cables are extended vertically downwardly from their respective overhead cable racks and positioned within, or immediately adjacent to, the corner formed by the arms of the cable bracket 70, from which they are further extended vertically and then horizontally into electrical contact with the mounted equipment. On the other hand, the transmission cables are also extended vertically downwardly from their overhead cable rack, but these cables are positioned within, or immediately adjacent to, the corner formed by the arms of the cable bracket 80, from which they are further extended vertically and then horizontally into electrical contact with the mounted equipment. As a result, the transmission cables are always spaced apart from the power cables.

While the conventional channel relay rack is useful, it does have several disadvantages. For example, the power, alarm and transmission cables are positioned outside of (rather than between) the arms of the U-shaped frame members 10 and 20, and thus these cables are exposed to inadvertent contact, and resulting damage, by operating personnel and passersby. In addition, it is often desirable to further separate the transmission cables according to function, i.e., according to whether the cables are used to transmit electrical signals to, or from, the mounted equipment, in order to avoid cross talk between the functionally different cables. However, this is not possible with a conventional channel relay rack because the cable brackets included in such racks serve to achieve nothing more than the physical separation of transmission cables (regardless of function) from power and alarm cables. Further, because the cable brackets 70 and 80 protrude from the relay rack, and are of steel, they represent a safety hazard to operating personnel. Additionally, because the conventional channel relay rack is entirely of steel, it is heavy and therefore difficult to install, whether or not filled with equipment, because much of the weight of a conventional, filled channel relay rack is attributable to the weight of the steel frame members. Moreover, because the conventional channel relay rack is not extendible (in terms of height), it is generally necessary to stock all four sizes of relay rack, which increases shipping costs and often necessitates the use of a relatively large amount of limited, and thus expensive, storage space.

Figure 2:
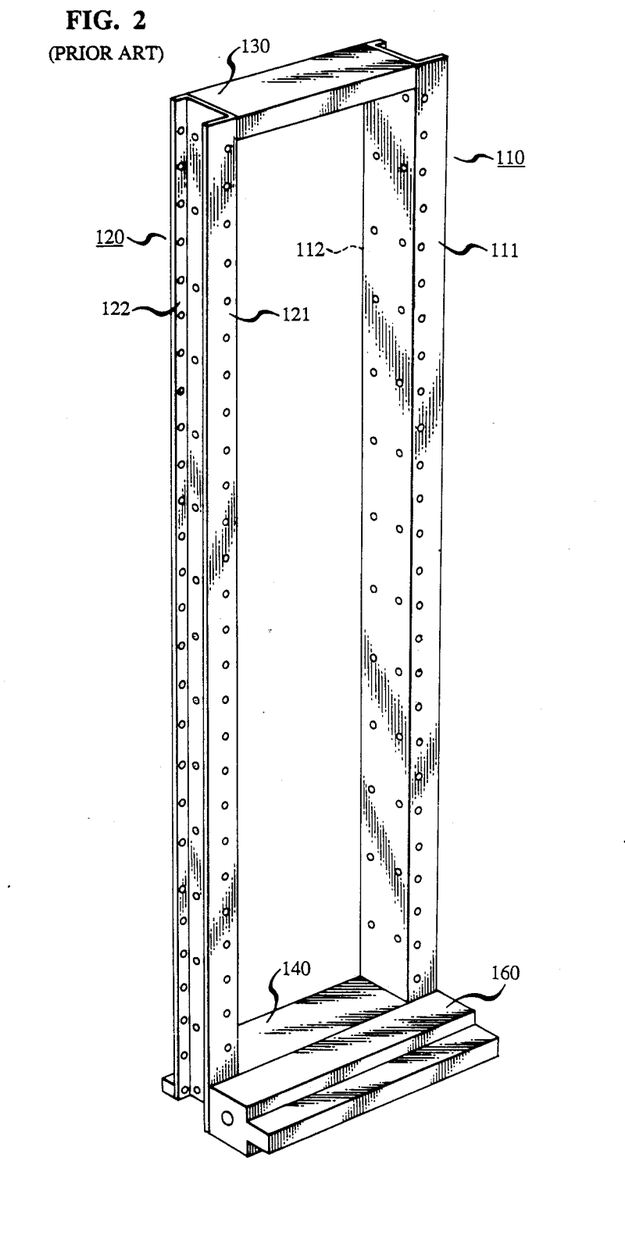
FIG. 2 depicts a conventional duct-type relay rack.

The second type of relay rack employed by the telephone companies is depicted in FIG. 2 and is generally referred to as a duct-type relay rack. As shown in FIG. 2, a conventional duct-type relay rack is similar to a conventional channel relay rack in that it includes two generally parallel (in use, generally vertically oriented) steel frame members 110 and 120 which are U-shaped in cross section and have arms which are apertured. However, by contrast with the conventional channel relay rack, the arms 111 and 112 of the frame member 110 point away from the arms 121 and 122 of the frame member 120. In addition, the arms 112 and 122 have identical widths which are smaller than the identical widths of the arms 111 and 121. In all other respects, the conventional duct-type relay rack is generally structurally similar to the conventional channel relay rack. That is, the conventional duct-type relay rack further includes steel cross members 130 and 140 connected to, respectively, the tops and bottoms of the U-shaped frame members 110 and 120, as well as a steel guardrail 160 (of the type pictured in FIG. 2) projecting (by a fixed distance) from the bottom of the duct-type relay rack.

In use, the conventional duct-type relay racks are often placed very close to one another, and thus the relatively wide arms 111 and 121 (see FIG. 2) of the U-shaped frame members of one relay rack often project into contact, or into close proximity, with the corresponding arms of the U-shaped frame members of adjacent duct-type relay racks. Moreover, any intervening space between the adjacent, relatively wide arms is often covered, at least in part, by a plate. As a consequence, two substantially enclosed, vertical ducts (hence the name of the relay rack) are formed on the opposite sides of each duct-type relay rack. In addition, the smaller widths of the frame member arms 112 and 122 (see FIG. 2) results in a gap between the arm 112 of one rack and the arm 122 of an adjoining rack, thus permitting access to the rear of the vertical duct formed by the arms of the two racks. Significantly, in use, the power and alarm cables are extended vertically downwardly into one such (substantially enclosed) vertical duct, the transmission cables are extended vertically downwardly into the other such vertical duct, and both sets of cables are then extended horizontally (out through the gaps in the vertical ducts) into electrical contact with the mounted equipment. Thus, this rack configuration is advantageous because, while the power and transmission cables are physically separated, all the cables are largely enclosed by the arms of adjacent U-shaped frame members, and therefore protected against inadvertent damage by operating personnel.

Although the conventional duct-type relay rack has a configuration which prevents inadvertent damage to power, alarm and transmission cables by operating personnel, it, like the conventional channel relay rack, is incapable of achieving physical separation between functionally different transmission cables, i.e., between the transmission cables used to transmit, and receive, electrical signals. The conventional duct-type relay rack is also entirely of steel, and thus heavy and difficult to install. In addition, like the conventional channel relay rack, the duct-type relay rack is not extendible (in terms of height), i.e., it is only manufactured in the four different sizes, given above. Because all four sizes must generally be stocked, the use of the conventional duct-type relay rack also involves high shipping costs and also requires the use of a relatively large amount of limited, and therefore expensive, storage space.

Thus, those engaged in the development of equipment racks have sought rack configurations which achieve physical separation between different types of cables, such as power and transmission cables, as well as between functionally different cables of the same type, such as transmission cables used for transmitting, and receiving, electrical signals, without the use of hazardous (to operating personnel) cable brackets. In addition, and equally importantly, those engaged in the development of equipment racks have also sought rack configurations which prevent inadvertent damage to cables, are height extendible, and are relatively light and therefore relatively easy to install.

SUMMARY OF THE INVENTION

The invention involves a rack having a configuration which achieves physical separation between different types of cables and/or between functionally different cables of the same type, without the use of hazardous cable brackets. In addition, the inventive rack protects cables against inadvertent damage by operating personnel, is height extendible, and is relatively light and thus relatively easy to install.

The inventive rack is similar to the conventional channel and duct-type relay racks in that it includes two frame members that are generally U-shaped in cross section, with the arms of each generally U-shaped frame member being apertured and either pointing toward or away from the arms of the other generally U-shaped frame member. However, and by contrast with the conventional relay racks, the inventive rack includes additional structures connected to, and extending from, the arms of at least one frame member, which serve to partially enclose the space between these arms. For example, if the arms of the frame members of the inventive rack point toward each other (as in a conventional channel relay rack), then each of the arms of at least one of the generally U-shaped frame members of the inventive rack includes a protrusion along its inner surface. On the other hand, if the arms of the frame members of the inventive rack point away from each other (as in a conventional duct-type relay rack), then the relatively wide arm of at least one of the frame members includes a protrusion along its inner surface, while the corresponding relatively narrow arm includes a flange extending from the edge of the arm. The two protrusions, or protrusion and flange, in conjunction with other portions of the corresponding frame member, serve to partially enclose the space between the arms, and thereby define a channel into which a device, here termed a cable restraint device, is readily inserted (through the space between the protrusions or protrusion and flange), and wedged. In a preferred embodiment, each such cable restraint device includes one or more physically separated loops, connected to the upper surface of the device, which project through the space between the protrusions or protrusion and flange. A strip of material, e.g., a nylon strip, is connected to each loop. In use, different types of cables and/or functionally different cables of the same type are extended vertically downwardly between the arms of the generally U-shaped frame member, and the material strips connected to the physically separated loops are used to separately bundle the cables according to type and/or function. In addition, all the cables are encircled by the arms and other portions of the generally U-shaped frame member, and are thus protected against inadvertent damage by operating personnel.

Significantly, the inventive rack is either of a fixed height, or is height extendible. That is, in the former case, the generally U-shaped frame members are manufactured to have a specified height, and cross members are connected to the tops and bottoms of the frame members. In the latter case, there is no cross member connecting the tops of the generally U-shaped frame members. Rather, the inventive rack includes two additional, generally U-shaped frame members (the movable frame members), each of which is sufficiently narrow so as to fit between the arms of one of the above-described generally U-shaped frame members (the stationary frame members). In addition, each of the movable frame members includes an indentation along the outer surface of one or both of its arms, which indentation receives a corresponding protrusion along the inner surface of an arm of the stationary frame member, the protrusion here serving as a keyway along which the movable frame member slides telescopically between the arms of the stationary frame member. By forming apertures in the arms of the movable frame members which correspond to the apertures in the arms of the stationary frame members, the movable frame members are, in use, telescoped to a desired height, and bolts or screws are readily extended through aligned apertures in the arms of the movable and stationary frame members to achieve a rack having any of a wide variety of heights.

Preferably, the arms of at least one of the movable frame members are fabricated to include protrusions, or a protrusion and a flange, which again define a channel into which a cable restraint device, of the type described above, is readily inserted and wedged. Thus, the height-extendible version of the inventive rack also achieves the advantages of the non-extendible version, i.e., different types of cables, as well as the same types of cables serving different functions, are also readily separately bundled (with the aid of the cable restraint device) and therefore physically separated. In addition, all the cables are enclosed by the arms and other portions of the movable frame member, and consequently all the cables are protected against inadvertent damage by operating personnel.

The inventive rack is preferably of aluminum, which is almost as strong as, but much lighter than, steel. As a result, the inventive rack is essentially as sturdy as the previously used steel racks, but much lighter and thus much easier to install than the previously used steel racks. Moreover, aluminum is readily extruded into the relatively complex shapes associated with the invention, e.g., generally U-shaped frame members with protrusions, which is presently not possible with, for example, steel.

BRIEF DESCRIPTION OF THE DRAWINGS

The invention is described with reference to the accompanying drawings, wherein.

DETAILED DESCRIPTION

The invention involves an equipment rack which achieves physical separation of cables according to type and/or function without the use of cable brackets, while protecting the cables from inadvertent damage by operating personnel. In addition, some embodiments of the rack are height extendible, thus obviating the need to buy, ship and store different sized fixed-height racks. Further, the rack is preferably of aluminum, and is therefore relatively light and easy to install.

As discussed, the inventive rack includes at least two frame members, generally U-shaped in cross section, having arms which either point toward each other, as in the conventional channel relay rack, or point away from each other, as in the conventional duct-type relay rack. However, by contrast with the conventional relay racks, the arms of at least one of the frame members of the inventive rack include protrusions or a protrusion and a flange which serve either of two functions. That is, if the inventive rack is, for example, of a fixed height, then the protrusions, or the protrusion and flange, in conjunction with other portions of the frame member, serve to partially enclose the space between the arms of the frame member, and thereby define a channel capable of receiving a cable restraint device. On the other hand, if the rack is height extendible, then the protrusions serve as keyways which allow movable frame members to slide telescopically between the arms of stationary frame members.

Figure 3:
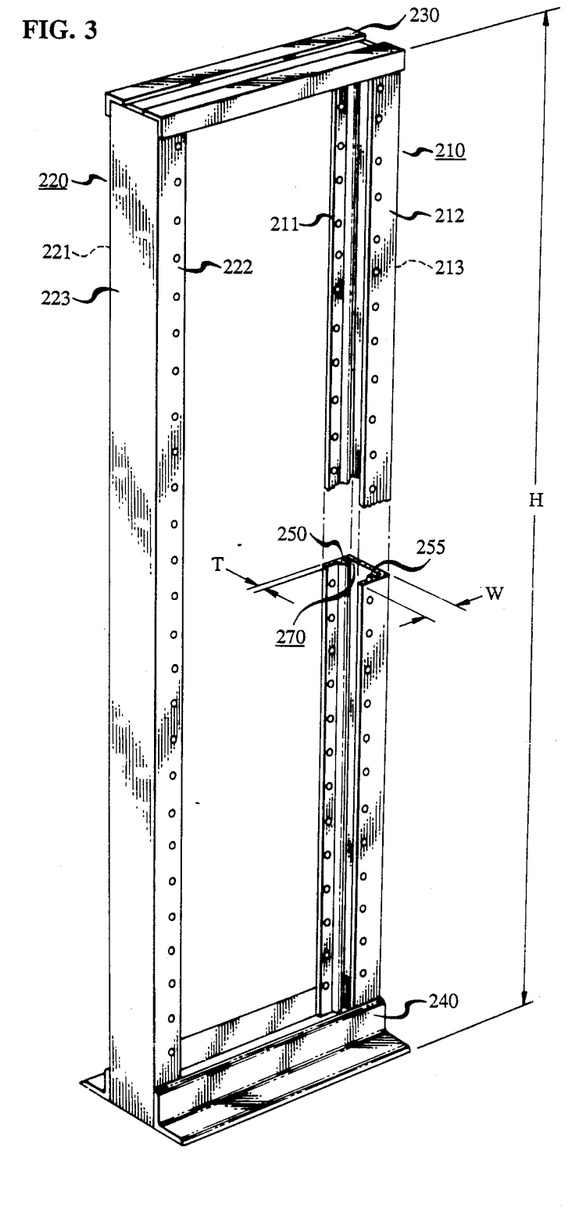
FIGS. 3 and 7 depict, respectively, first and second, fixed-height embodiments of the inventive rack.

With reference to FIG. 3, a first fixed-height embodiment of the inventive rack includes a first frame member 210, generally U-shaped in cross section, and a second frame member 220, also generally U-shaped in cross section. (To determine whether a frame member, when viewed in cross section, is generally U-shaped for purposes of the invention, identify the midpoint of the intersection of the arms of the frame member, i.e., where the arms are physically joined to create a frame member, and then draw a first straight line from this midpoint to the end of the first arm and a second straight line from the midpoint to the end of the second arm. To be considered generally U-shaped in cross section, the interior angle formed by the two straight lines must be less than 180 degrees. Thus, a frame member is considered generally U-shaped in cross section provided the arms are not colinear along their entire lengths. For example, frame members that are literally V-shaped or semi-circular in cross section are generally U-shaped for purposes of the invention.) While other configurations of the generally U-shaped frame members 210 and 220 are useful and encompassed by the present invention, the frame member 210 preferably includes substantially parallel arms 211 and 212 connected by a crosspiece 213, while the frame member 220 preferably includes substantially parallel arms 221 and 222 connected by a crosspiece 223. The frame members 210 and 220 are positioned substantially parallel to one another, with the arms 211 and 212 pointing toward the arms 221 and 222, as in the conventional channel relay rack. The frame members 210 and 220 are connected at corresponding top and bottom ends by, for example, angle irons 230 and 240, which are either welded or bolted to the frame members.

As depicted in FIG. 3, the arms 211, 212, 221 and 222 have identical dimensions, with the height, H, of each arm (and thus the height of the rack) being, for example, 7 feet (2.13 meters), 9 feet (2.74 meters), 10½ feet (3.20 meters) or 11½ feet (3.50 meters), so as to conform to current commercial practice. In addition, the width, W, of each arm is, for example, 1.38 inches (3.5 centimeters), while the thickness, T, of each arm is, for example, 0.188 inches (0.478 centimeters).

The crosspieces 213 and 223 preferably also have identical dimensions, with the height of each crosspiece corresponding to that of the frame member arms. In addition, the width of each crosspiece is, for example, 3.0 inches (7.62 centimeters), while the thickness of each crosspiece is, for example, 0.188 inches (0.478 centimeters).

The length of each of the angle irons 230 and 240, which defines the spacing between the frame members 210 and 220, is, for example, 24.5 inches (62.23 centimeters).

Figure 4:
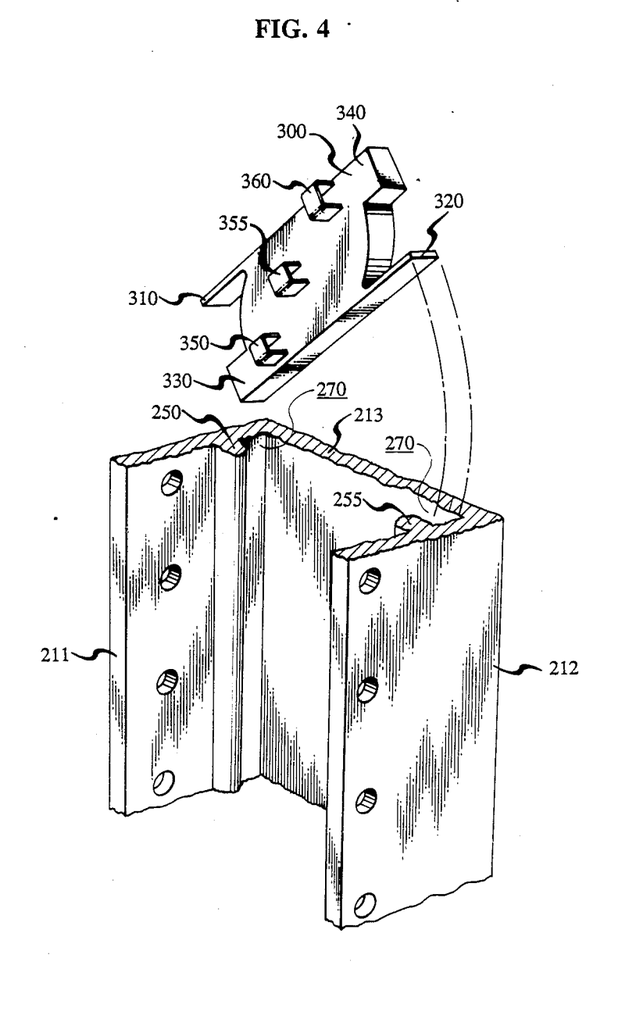
FIG. 4 is an expanded view of a portion of the first embodiment of the inventive rack, depicting use of a first, preferred embodiment of the inventive cable restraint device.

Significantly, in accordance with the invention, each of the arms of at least one of the frame members 210 and 220 includes a protrusion extending along at least a portion of the length of an inner surface of the arm. By way of example, and as depicted in FIGS. 3 and 4, the arms 211 and 212 of the frame member 210 include, respectively, a protrusion 250 and a protrusion 255. The two protrusions extend toward, but not into contact with, each other. In conjunction with the corresponding frame member crosspiece, e.g., the crosspiece 213, these protrusions define a channel 270 capable of receiving a cable restraint device (discussed below).

The protrusions 250 and 255 have any of a wide variety of useful, cross-sectional shapes. Included among these are triangular, semi-circular and rectangular shapes. Regardless of shape, there are two critical dimensions associated with each protrusion. The first of these is the maximum extent to which a protrusion projects from one arm toward the other arm of a frame member, which extent ranges from about 0.201 inches (0.51 centimeters) to about 0.213 inches (0.54 centimeters), and is preferably about 0.207 inches (0.525 centimeters). (This maximum extent is defined as the length of a perpendicular from a least-squares-fit planar approximation to the portion of the surface of a frame member arm covered by the protrusion to the furthest point of the protrusion from the planar approximation.) The second critical dimension is the minimum width of the base of the protrusion, this minimum width ranging from about 0.220 inches (0.56 centimeters) to about 0.240 inches (0.61 centimeters), and preferably being about 0.230 inches (0.585 centimeters). There is also a third dimension, i.e., the length of the protrusion, which is preferably equal to the length of the frame member arm. Maximum projection extents less than about 0.201 inches (0.51 centimeters) are undesirable because the corresponding protrusions lead to arms which lack adequate structural rigidity, while maximum projection extents greater than about 0.213 inches (0.54 centimeters) are undesirable because the corresponding protrusions add an undesirably large amount of weight (and thus cost) to the frame members. Minimum widths less than about 0.220 inches (0.56 centimeters) and minimum widths greater than about 0.240 inches (0.61 centimeters) are undesirable for the above reasons.

The width of the channel 270 is determined by the width of the crosspiece 213 and the thicknesses of the arms 211 and 212. Thus, based on the above dimensions, this width is, for example, 2.624 inches (6.66 centimeters).

The depth of the channel 270, i.e., the distance between a protrusion and the adjacent crosspiece, ranges from about 0.244 inches (0.62 centimeters) to about 0.262 inches (0.665 centimeters), and is preferably about 0.254 inches (0.645 centimeters). Depths less than about 0.244 inches (0.62 centimeters) are undesirable because the corresponding channels are too shallow to receive a cable restraint device of the type discussed below, while depths greater than about 0.262 inches (0.665 centimeters) are undesirable because such large depths are generally achieved by reducing the thickness of the crosspiece, leading to an undesirably weak crosspiece.

Figure 7:
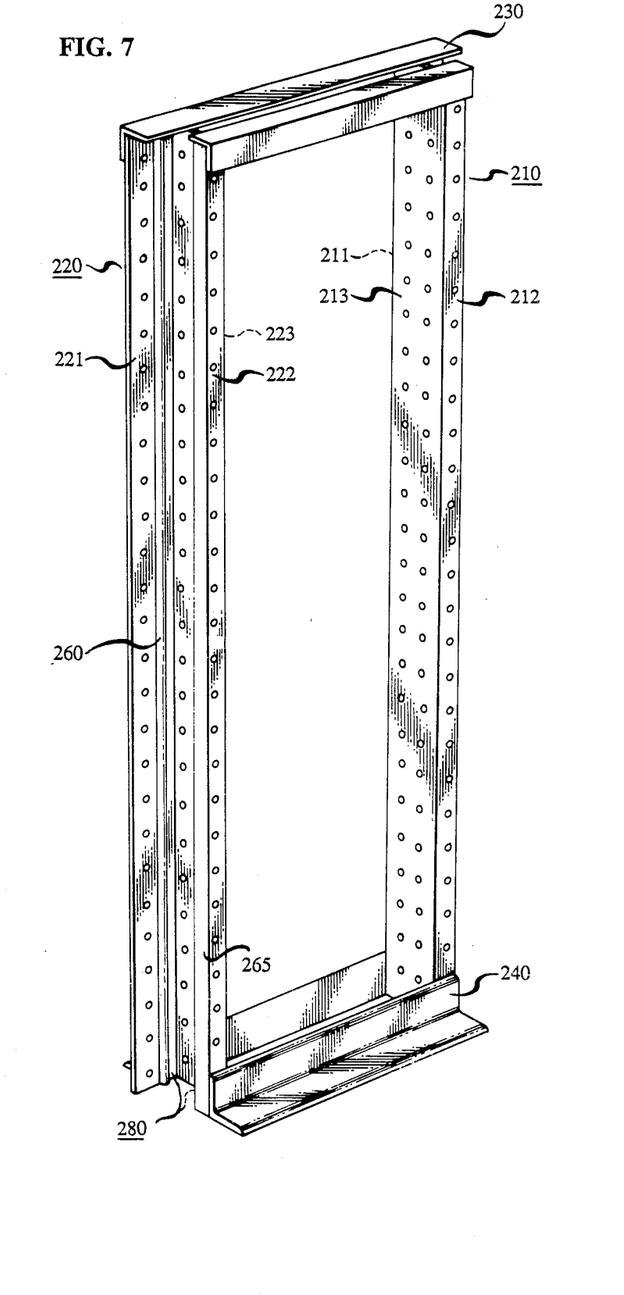

With reference to FIG. 7, a second fixed-height embodiment of the inventive rack is generally similar to the first fixed-height embodiment, except that the arms of the generally U-shaped frame members 210 and 220 point away from each other, as in the conventional duct-type relay rack. In addition, as shown in FIG. 7, the arms 212 and 222 have identical widths which are smaller than the identical widths of the arms 211 and 221. Thus, when the rack is in abutting contact with another such rack, a gap is formed between the arm 212 of one rack and the arm 222 of the other rack, permitting access to the vertical duct formed by the adjoining racks.

The widths of the relatively wide arms 211 and 221 are, for example, 2.25 inches (5.72 centimeters), while the widths of the relatively narrow arms 212 and 222 are, for example, 0.875 inches (2.22 centimeters). The widths of the crosspieces 213 and 223 are, for example, 5.0 inches (12.7 centimeters). The thicknesses of the arms and of the corresponding crosspieces are, for example, 0.188 inches (0.48 centimeters.)

As with the first embodiment, the relatively wide arm of at least one of the frame members, e.g., the arm 221, includes a protrusion 260 (see FIG. 7) on its inner surface. However, by contrast with the first embodiment, the corresponding, relatively narrow arm of the same frame member, e.g., the arm 222, does not include such a protrusion. Rather, because there is insufficient surface area to provide both a protrusion and apertures along the length of the relatively narrow arm 222, this arm includes a flange 265 projecting from the edge of the arm. This flange is, for example, perpendicular to the arm 222, and is generally aligned with and projects toward, but not into contact with, the protrusion 260. In conjunction with the corresponding frame member crosspiece, the protrusion 260 and flange 265 define a channel 280 capable of receiving a cable restraint device.

Like the protrusions of the first embodiment, the protrusion 260 can have any of a wide variety of useful, cross-sectional shapes, e.g., triangular, semi-circular and rectangular. In addition, the protrusion 260 is characterized by the same two critical dimensions that characterize the protrusions of the first embodiment. However, because the dimensions of the relatively wide arm 221 differ from those of the first embodiment, the two critical dimensions for the protrusion 260 also differ. That is, the maximum extent to which the protrusion 260 projects from the arm 221 toward the arm 222 ranges from about 0.140 inches (0.355 centimeters) to about 0.150 inches (0.38 centimeters), while the minimum width of the base of the protrusion ranges from about 0.122 inches (0.31 centimeters) to about 0.128 inches (0.325 centimeters). Dimensions outside these ranges are undesirable for the reasons given above. Moreover, the length of the protrusion 260 also preferably extends over the length of the frame member arm.

The height and thickness of the flange 265 are the same as those of the relatively narrow arm 222. The width of the flange 265 ranges from about 0.680 inches (1.73 centimeters) to about 0.690 inches (1.75 centimeters). Widths less than about 0.680 inches (1.73 centimeters) are undesirable because they lead to flanges having relatively low mechanical strength. Widths greater than about 0.690 inches (1.75 centimeters) are undesirable because the flange unnecessarily reduces the space available for cable storage.

Preferably, the fixed-height embodiments of the inventive rack are of aluminum, which is readily extruded into, for example, generally U-shaped frame members with protrusions. Because aluminum is almost as strong as, but much lighter than, steel, the fixed-height embodiments of the inventive rack are essentially as sturdy as the previously used racks, but are much lighter and thus much easier to install, whether filled with equipment or empty.

Figure 5:
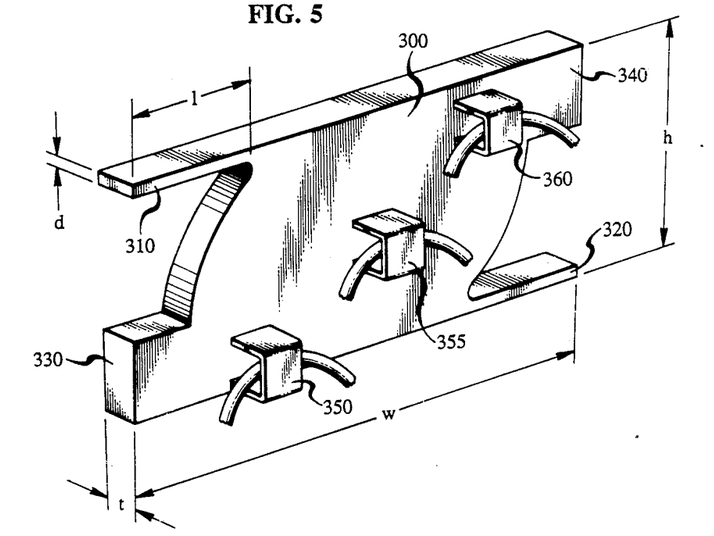
FIGS. 5 and 6 depict, respectively, the first, preferred embodiment, and the second embodiment, of the inventive cable restraint device.
Figure 6:
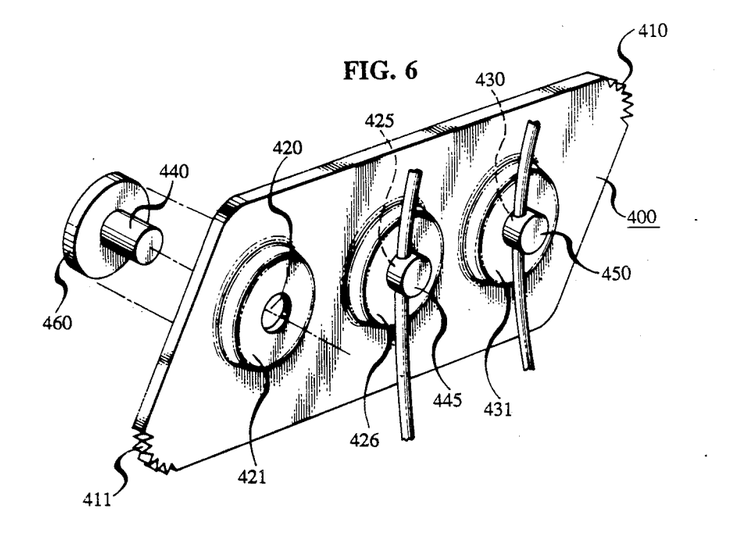

With reference to FIGS. 4, 5 and 6, the invention also involves a device, termed a cable restraint device, which is readily inserted, and wedged, into the channels 270 and 280, and serves to separately bundle cables according to type and/or function. As shown in FIGS. 4 and 5, a first, preferred embodiment of the cable restraint device includes a generally rectangular material region 300 of elastic material, such as nylon. To fit into a channel, e.g., the channel 270, the material region 300 must have a thickness, t (see FIG. 5), which is equal to or less than the depth of the channel, as well as a width, w, which is equal to or less than the width of the channel. In this regard, in accordance with the channel dimensions given above, the thickness, t, of the material region 300 is, for example, about 0.125 inches (0.318 centimeters), while the width, w, is, for example, about 2.62 inches (6.66 centimeters). In addition, the height, h, of the material region 300 is, for example, about 1.0 inch (2.54 centimeters).

The generally rectangular material region 300 also includes a pair of diagonally opposing flexible (i.e., elastic) arms 310 and 320 and a pair of diagonally opposing (relatively nonflexible) shoulders 330 and 340. Significantly, to achieve wedging (described below), the diagonal dimensions between the opposing ends of the flexible arms 310 and 320 and between the opposing ends of the nonflexible shoulders 330 and 340 should be greater than the width of the channel. In this regard, in accordance with the channel dimensions given above, these diagonal dimensions are, for example, about 2.79 inches (7.08 centimeters). In addition, the length, l, of each of the flexible arms (see FIG. 5) is, for example, about 0.4375 inches (1.11 centimeters), while the height, d, of the arms is, for example, about 0.0781 inches (0.1984 centimeters).

In use, as depicted in FIG. 4, the first embodiment of the cable restraint device is inserted vertically into the channel 270 (i.e., such that the two longest sides of the device are substantially parallel to the height dimension, H, of the frame member) and rotated in the clockwise or counterclockwise direction. Because the diagonal dimension between the arms 310 and 320 is greater than the width of the channel, the arms undergo bending as soon as the arms contact the sidewalls of the channel. Rotation of the device, and thus bending of the arms, is continued until the device is horizontal (as viewed in FIG. 4). At this point, the elastic, bent arms snap into abutting contact with the sidewalls of the channel, effectively wedging the device in the channel. Moreover, because the diagonal dimension between the shoulders 330 and 340 is greater than the width of the channel, the shoulders preclude rotation beyond the horizontal position.

As depicted in FIG. 5, the first embodiment of the cable restraint device also includes at least one loop 350, and preferably two or more loops, e.g., loops 350, 355 and 360, of, for example, nylon, projecting from the surface of the material region 300. A strip of material, e.g., a nylon strip, extends through each loop. Once the cable restraint device is inserted and wedged into a channel, then the material strips are available for separately bundling cables according to type and/or function.

With reference to FIG. 6, a second embodiment of the cable restraint device is similar to the first embodiment in that it includes a generally parallelogram-shaped material region 400 of metal, e.g., steel, having the same thickness, width and height dimensions as those of the material region 300. This second embodiment differs from the first embodiment in that the material region 400 includes diagonally opposing sets of teeth 410 and 411. Significantly, the diagonal dimension between these teeth is greater than the width of the channel into which the device is to be inserted and wedged, this diagonal dimension being, for example, 1.843 inches (4.68 centimeters). In use, the second embodiment is inserted vertically into, for example, the channel 270, and then rotated in the clockwise or counterclockwise direction to a horizontal position, at which point the teeth 410 and 411 begin to dig into the sidewalls of the channel. It should be noted that further rotation is precluded, and thus wedging is achieved, precisely because the diagonal dimension between the teeth is greater than the width of the channel.

As depicted in FIG. 6, the second embodiment of the cable restraint device also includes at least one aperture, and preferably two or more apertures, e.g., the apertures 420, 425 and 430, in the material region 400. These apertures, which can have any of a wide variety of shapes, e.g., circular, rectangular or triangular, are conveniently formed using a punch press. As a result, each aperture is encircled by a depression of corresponding shape. Thus, if the apertures 420, 425 and 430 (see FIG. 6) are circular, then these apertures will be encircled by, respectively, circular depressions 421, 426 and 431.

The apertures in the material region 400 serve to receive cylinders, e.g., cylinders 440, 445 and 450 (see FIG. 6), which protrude through the apertures. In cross section, these cylinders have the same shapes as, but slightly smaller dimensions than, the apertures. Significantly, the protruding end of each cylinder includes a transverse hole (i.e., a hole which is transverse to the longitudinal axis of the cylinder) containing a material strand, e.g., a nylon strand, used for bundling cables.

In use, each cylinder must protrude through an aperture without falling out of the aperture. To this end, each cylinder is provided with a head 460 (see FIG. 6) having a cross-sectional dimension, e.g., a diameter, larger than the corresponding dimension of the aperture. In addition, the head has a thickness which is preferably equal to the depth of the corresponding depression. When the cable restraint device is inserted into a channel, the head 460 of each cylinder contacts the crosspiece of the generally U-shaped frame member. If a cylinder is in, but fails to protrude through, an aperture of the material region 400, then this contact with the crosspiece forces the head 460 into flush engagement with the back surface of the material region 400 (the surface which contacts the crosspiece), which, in turn, forces the cylinder to protrude through, while preventing the cylinder from falling out of, the aperture.

If, for example, the cylinders are circular cylinders, then the diameters of the cylinders and, therefore, the diameters of the apertures, are, for example, about 0.25 inches (0.635 centimeters). In addition, the length of each cylinder, excluding the head 460, is, for example, about 0.25 inches (0.635 centimeters).

If the heads 460 are circular, then the diameters of the heads are, for example, about 0.50 inches (1.27 centimeters). In addition, the thicknesses of the heads are, for example, about 0.0625 inches (0.1588 centimeters).

Figure 8:
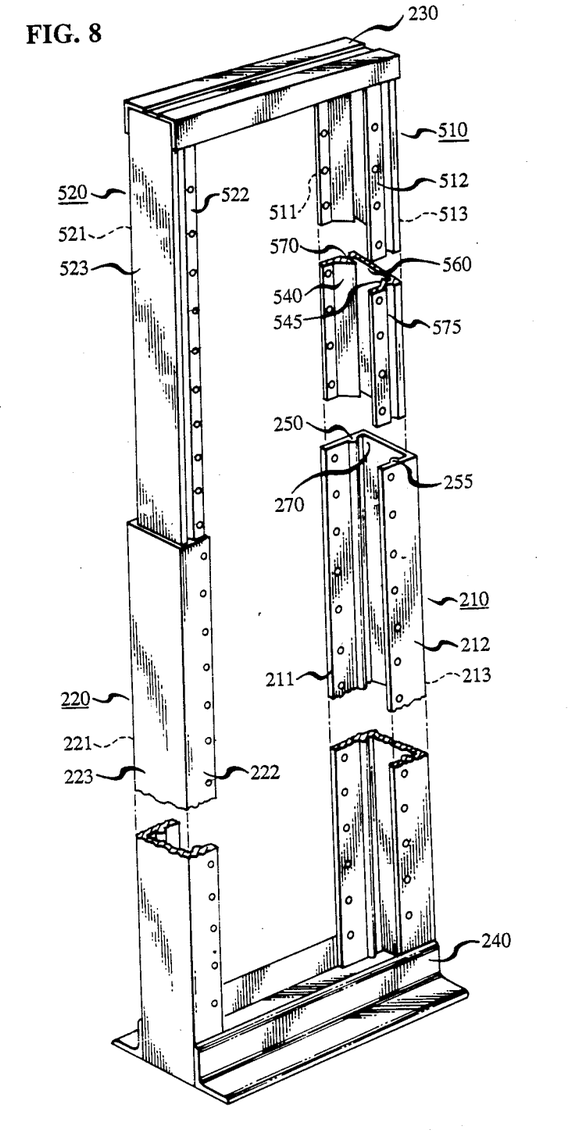
FIGS. 8 and 10 depict, respectively, third and fourth, height extendible embodiments of the inventive rack.
Figure 10:
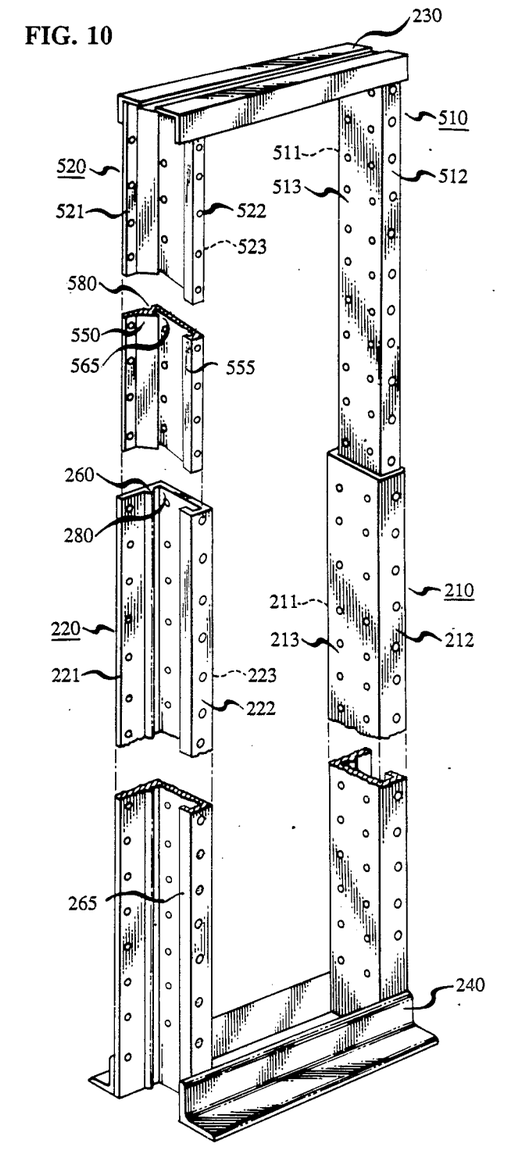

As depicted in FIGS. 8 and 10, the third and fourth embodiments of the inventive rack are similar to each other in that they are both height extendible. That is, each of the third and fourth embodiments includes first and second generally U-shaped, stationary frame members 210 and 220, as well as third and fourth movable frame members 510 and 520, both of which are also generally U-shaped in cross section. Like the frame members 210 and 220, the frame members 510 and 520 can have any of a wide variety of useful configurations. However, as with the frame members 210 and 220, the frame member 510 preferably includes substantially parallel arms 511 and 512 connected by a crosspiece 513, and the frame member 520 preferably also includes substantially parallel arms 521 and 522 connected by a crosspiece 523. As mentioned above, and as discussed more fully below, the movable frame members 510 and 520 slide telescopically between the arms of the stationary frame members 210 and 220. To achieve such telescoping action, each of the movable frame members 510 and 520 must be sufficiently narrow to fit between the arms of one of the stationary frame members. In addition, to permit the ready insertion of cable restraint devices, the arms of the movable frame members 510 and 520 point in the same direction as those of the stationary frame members 210 and 220. Thus, in the case of, for example, the third embodiment (see FIG. 8), where the arms 211 and 212 of the frame member 210 point toward the arms 221 and 222 of the frame member 220, the arms 511 and 512 of the frame member 510 also point toward the arms 521 and 522 of the frame member 520. Similarly, in the fourth embodiment (see FIG. 10), where the arms 211 and 212 point away from the arms 221 and 222, the arms 511 and 512 point away from the arms 521 and 522.

As depicted in FIG. 8, the arms 511, 512, 521 and 522 of the third, height extendible embodiment have identical dimensions. Consistent with the dimensions for the corresponding stationary frame members, given above, the height, thickness and width of each arm is, for example, about 7 feet (2.13 meters), about 0.220 inches (0.559 centimeters) and about 1.172 inches (2.98 centimeters), respectively.

The crosspieces 513 and 523 of the third embodiment also have identical dimensions, with the height of each crosspiece being the same as that of the arms. In addition, the width of each crosspiece is, for example, about 2.218 inches (5.63 centimeters), while the thickness of each crosspiece is, for example, about 0.188 inches (0.478 centimeters).

As shown in FIG. 8, the stationary frame members 210 and 220 are connected at corresponding bottom ends by, for example, angle irons 240. Moreover, the movable frame members 510 and 520 are connected at corresponding top ends by, for example, angle irons 230, where both angle irons 230 and 240 are either bolted or welded to the frame members.

Figure 9:
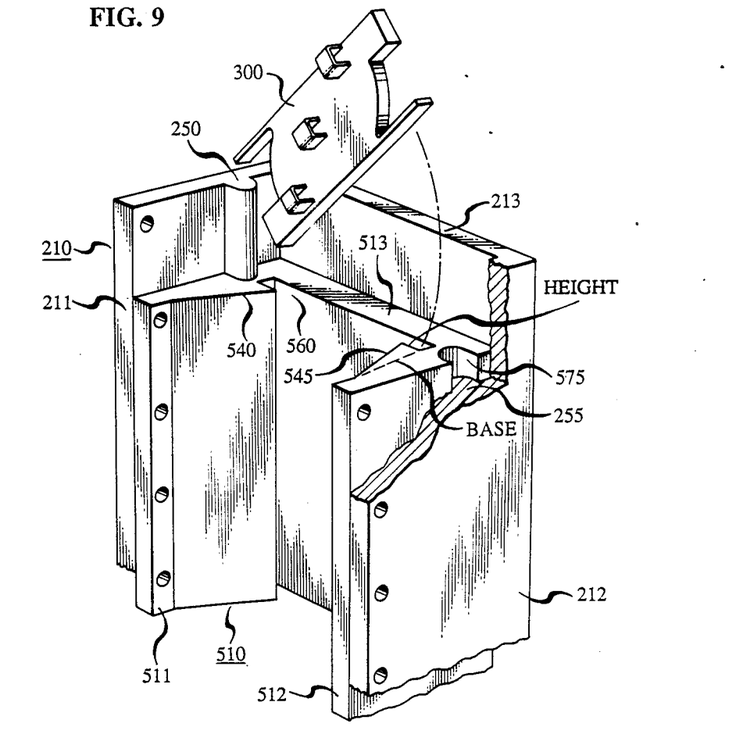
FIG. 9 is an expanded view of a portion of the third (height extendible) embodiment of the inventive rack, depicting use of the preferred embodiment of the cable restraint device.

Significantly, in the third embodiment, each of the arms of the movable frame members includes an indentation extending along at least a portion of the length of the outer surface of the arm. For example, as depicted in FIGS. 8 and 9, each of the arms 511 and 512 of the movable frame member 510 includes, respectively, an indentation 570 and an indentation 575. These indentations correspond to, and receive, the protrusions along the inner surfaces of the arms of the stationary frame members, and thus the protrusions serve as keyways along which the movable frame members slide telescopically between the arms of the stationary frame members. By forming apertures in the arms of the movable frame members which correspond to apertures in the arms of the stationary frame members, the movable frame members are, in use, telescoped to a desired height, and bolts or screws are readily extended through aligned apertures in the arms of the movable and stationary frame members to achieve a rack having any of a wide variety of heights.

Figure 11:
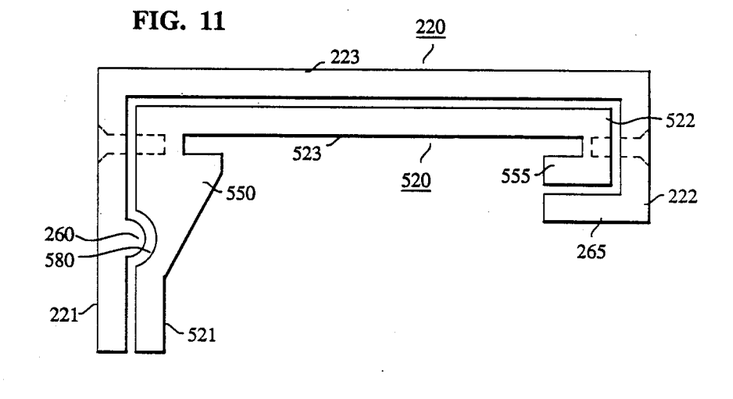
FIG. 11 is a cross-sectional view of the fourth (height extendible) embodiment of the inventive rack, depicted in FIG. 10.

With reference to FIGS. 10 and 11, the arms 512 and 522 of the movable frame members 510 and 520 of the fourth, height extendible embodiment have identical widths which are smaller than the identical widths of the arms 511 and 521. Consistent with the dimensions for the corresponding stationary frame members, given above, the widths of the relatively narrow arms 512 and 522 are, for example, about 0.460 inches (1.17 centimeters), while the widths of the relatively wide arms 511 and 521 are, for example, about 2.03125 inches (5.16 centimeters). The heights and thicknesses of these arms are, for example, 7 feet (2.13 meters) and 0.188 inches (0.48 centimeters), respectively.

The crosspieces 513 and 523 of the fourth embodiment have identical dimensions, with the height of each crosspiece being the same as that of the arms. In addition, the width of each crosspiece is, for example, about 4.60 inches (11.68 centimeters), while the thickness of each crosspiece is, for example, about 0.188 inches (0.48 centimeters).

Significantly, only the relatively wide arm of each movable frame member includes an indentation which receives the corresponding protrusion on the relatively wide arm of the stationary frame member. For example, as depicted in FIGS. 10 and 11, only the arm 521 includes an indentation 580 which receives the protrusion 260 on the arm 220. Thus, in conjunction with the flange 265 on the arm 222, which serves to contain the movable frame member 520, the protrusion 260 serves as a keyway along which the movable frame member 520 slides telescopically between the arms of the stationary frame member 220.

Just as the protrusions of the stationary frame members can have any of a wide variety of useful shapes, the indentations of the movable frame members, in both the third and fourth embodiments, can also assume a wide variety of corresponding shapes including, for example, triangular, rectangular and semi-circular shapes. By way of example, and as depicted in FIGS. 8 and 10, the indentations 570, 575 and 580 have semi-circular cross-sectional shapes and radial dimensions corresponding to the semi-circular cross-sectional shapes and radial dimensions of the protrusions 250, 255 and 260.

With reference once again to FIGS. 8 and 9, the arms of the movable frame members 510 and 520 in the third embodiment preferably include protrusions similar in design and function to the protrusions of the stationary frame members 210 and 220. The protrusions on the movable frame members, e.g., the protrusions 540 and 545 of the arms 511 and 512, are characterized by the two critical dimensions, discussed above. Thus, for example, if the protrusions have right triangular cross-sectional shapes (as depicted in FIGS. 8 and 9), then the height of the right triangle (see FIG. 9) is, for example, about 0.125 inches (0.318 centimeters) and the base is, for example, about 0.362 inches (0.919 centimeters). In addition, the depth of the corresponding channel 560 (see FIGS. 8 and 9) is, for example, about 0.125 inches (0.318 centimeters).

With reference to FIGS. 10 and 11, each of the movable frame members of the fourth embodiment preferably includes a protrusion and a corresponding flange. For example, as shown in FIGS. 10 and 11, the arm 521 of the movable frame member 520 includes a protrusion 550, while the corresponding arm 522 includes a flange 555. In cross-section, the protrusion 550 has the shape of, for example, a right triangle with a flattened top. The base of this right triangle is, for example, about 1.718 inches (4.364 centimeters) long, the height of this right triangle (from the base to the flattened top) is, for example, about 0.48 inches (1.2192 centimeters), while the length of the flattened top is, for example, about 0.125 inches (0.3175 centimeters). The width of the flange 555, is, for example, about 0.480 inches (1.2192 centimeters), while the thickness of the flange is, for example, about 0.147 inches (0.3734 centimeters).

The protrusions, or protrusion and flange, of each movable frame member, in conjunction with the other portions of the movable frame member, in both the third and fourth embodiments, again define a channel similar to the channels of the fixed height embodiments, into which a cable restraint device is readily inserted and wedged. Thus, the height extendible versions of the inventive rack also achieve the separate bundling of cables according to type and/or function. The embodiments of the cable restraint device useful in the height extendible embodiments of the invention include those shown in FIGS. 5 and 6.

Preferably, and like the fixed height embodiments of the inventive rack, the height extendible embodiments are of aluminum, and are therefore also relatively light and relatively easy to install.

Figure 12:
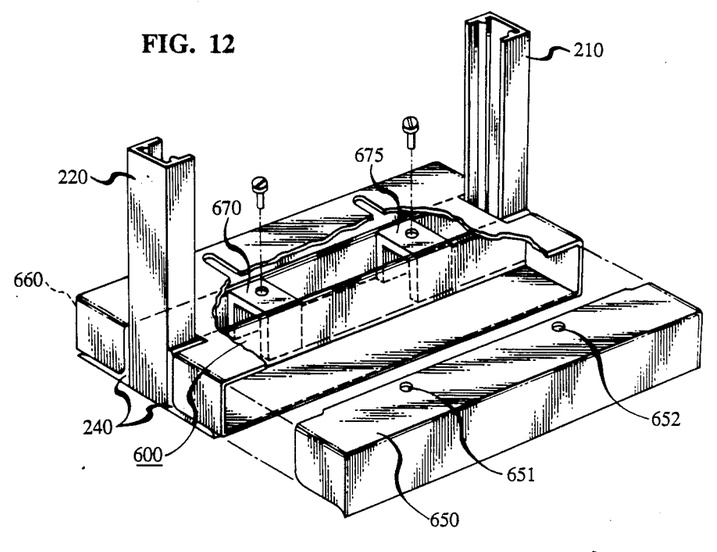
FIGS. 12 and 13 depict an extendible guardrail, preferably included with the inventive rack.
Figure 13:
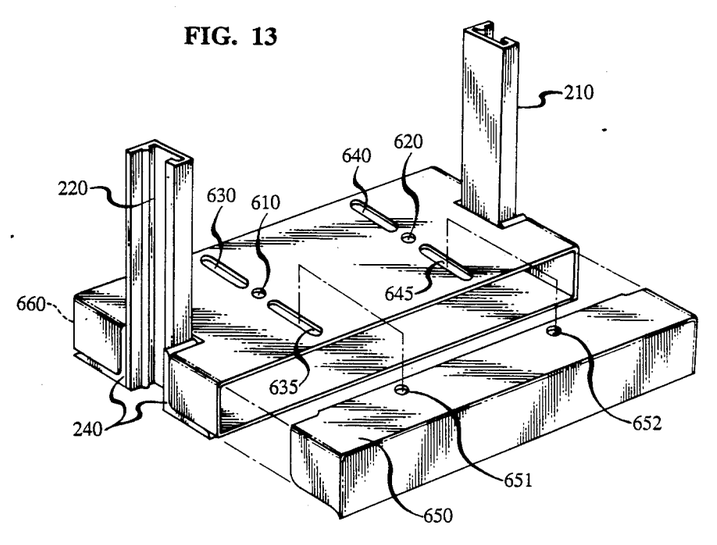

As depicted in FIGS. 12 and 13, the inventive rack preferably includes an extendible guardrail which is applicable to both channel (see FIG. 12) and duct-type (see FIG. 13) embodiments. This guardrail includes an open-sided box 600 which fits between, and is fixed relative to, the U-shaped frame members 210 and 220 and is hereafter referred to as the fixed element 600 of the guardrail. Two sliding elements 650 and 660 are dimensioned to fit within the open-sided fixed element 600, enabling the guardrail to be extended to any of a variety of desired positions. That is, as depicted in FIG. 12, the guardrail also includes mounting bars 670 and 675 bolted or welded to the opposing surfaces of the angle irons 240, which are, in turn, bolted or welded to the bottom ends of the frame members 210 and 220. Each mounting bar includes a centrally located hole that corresponds to two centrally located holes 610 and 620 in the fixed element 600. The fixed element is placed between the frame members, and a bolt or screw is readily extended through the aligned holes to fasten the fixed element to the mounting bars.

As depicted in FIG. 13, the fixed element 600 includes elongated slots 630, 635, 640 and 645 in its upper surface, while the sliding elements include apertures 651 and 652 which are designed to be positioned beneath, and aligned with, the slots at any position along the length of the slots. Thus, when the sliding elements 650 and 660 are inserted into the openings in the fixed element 600, a bolt or screw is readily extended through the apertures and the slots to fix the sliding elements at any of a wide variety of positions along the slots. Inward movement of the sliding elements is possible until the elements abut flush with the outer surfaces of the angle irons, while the outermost extent of the elements is limited by the dimensions of the elongated slots. Thus, within these limits, a guardrail extendible to a wide variety of desired positions is achieved.

It should be noted that, like the conventional relay rack, the inventive rack is intended to be sold either empty of equipment, or at least partially filled with equipment, e.g., electronic telephone switching or electronic telephone transmission equipment.

We claim:

1. Apparatus for holding electronic equipment comprising:
   a first frame member, generally U-shaped in cross section, including a first pair of arms and first enclosing means connected to said first pair of arms, for partially enclosing at least a portion of the space between said first pair of arms, whereby a first partially enclosed channel is formed between said first pair of arms;
   a second frame member, generally U-shaped in cross section, including a second pair of arms;
   connecting means for connecting at least one pair of ends of said frame members to each other; and
   first bundling means positioned in said first channel, for bundling cables.

2. The apparatus of claim 1 wherein said first bundling means includes a material region having a thickness equal to or less than a depth of said first channel, a width dimension equal to or less than a width of said first channel, and a diagonal dimension which is greater than said width of said first channel.

3. The apparatus of claim 2 wherein said material region includes diagonally opposing flexible arms, said diagonal dimension extending between the diagonally opposing ends of said flexible arms.

4. The apparatus of claim 2 wherein said material region includes diagonally opposing sets of teeth, said diagonal dimension extending between said sets of teeth.

5. The apparatus of claim 2 wherein said first bundling means also includes at least one loop, projecting from a surface of said material region, which loop includes a material strand serving to bundle cables.

6. The apparatus of claim 2 wherein said first bundling means also includes at least one cylinder protruding through an aperture in said material region, the protruding end of said cylinder including an aperture transverse to a longitudinal axis of said cylinder, said aperture in said protruding end containing a material strand serving to bundle cables.

7. Apparatus for holding electronic equipment comprising:
   a first frame member, generally U-shaped in cross section, including a first pair of arms and first enclosing means connected to said first pair of arms, for partially enclosing at least a portion of the space between said first pair of arms, whereby a first partially enclosed channel is formed between said first pair of arms, said first enclosing means comprising first protrusion means extending along at least a portion of the length of an inner surface of the arms of said first frame member;
   a second frame member generally U-shaped in cross section, including a second pair of arms;
   connecting means for connecting at least one pair of ends of said frame members to each other; and
   a third frame member generally U-shaped in cross section, including a third pair of arms, said third frame member being sufficiently narrow to fit between the arms of said first frame member, and at least one of said third pair of arms including an outer surface with indentation means for receiving a respective said first protrusion means whereby said third frame member is capable of sliding telescopically between the arms of said first frame member.

8. The apparatus of claim 7 further comprising a fourth frame member, generally U-shaped in cross section, including a fourth pair of arms, said fourth frame member being sufficiently narrow to fit between the arms of said second frame member.

9. The apparatus of claim 7 further comprising a third protrusion extending along at least a portion of the length of an inner surface of one of the arms of said third frame member and a fourth protrusion extending along at least a portion of the length of an inner surface of the other arm of said third frame member, said third and fourth protrusions extending toward, but not into contact with, each other, a third partially enclosed channel being defined by said third and fourth protrusions and the other portions of said third frame member.

10. The apparatus of claim 9 further comprising second bundling means, capable of being inserted, and wedged, into said third channel, for bundling cables.

11. The apparatus of claim 8 further comprising fastening means for fastening said third and fourth frame members to, respectively, said first and second frame members after said third and fourth frame members have been adjusted to a desired height with respect to said first and second frame members.

12. The apparatus of claim 11 wherein said fastening means includes at least first, second, third and fourth apertures in, respectively, said first, second, third and fourth frame members and at least first and second bolts or screws capable of being extended through, respectively, said first and third apertures and said second and fourth apertures when said first and second apertures are aligned with, respectively, said third and fourth apertures.

* * * * *